United States Patent
Rashed et al.

(10) Patent No.: US 9,147,028 B2
(45) Date of Patent: Sep. 29, 2015

(54) FORMING MODIFIED CELL ARCHITECTURE FOR FINFET TECHNOLOGY AND RESULTING DEVICE

(71) Applicant: GLOBALFOUNDRIES INC., Grand Cayman (KY)

(72) Inventors: Mahbub Rashed, Cupertino, CA (US); Lei Yuan, Cupertino, CA (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 190 days.

(21) Appl. No.: 13/902,395

(22) Filed: May 24, 2013

(65) Prior Publication Data

US 2014/0346662 A1 Nov. 27, 2014

(51) Int. Cl.
*G06F 17/50* (2006.01)
*H01L 29/66* (2006.01)
*H01L 29/78* (2006.01)

(52) U.S. Cl.
CPC ........ *G06F 17/5072* (2013.01); *G06F 17/5068* (2013.01); *H01L 29/66795* (2013.01); *H01L 29/785* (2013.01); *Y02T 10/82* (2013.01)

(58) Field of Classification Search
CPC .................................. G06F 17/30; G06F 17/50
USPC .......................................................... 716/120
See application file for complete search history.

(56) References Cited

U.S. PATENT DOCUMENTS

2009/0249274 A1* 10/2009 Liu .................................. 716/9
2012/0241986 A1* 9/2012 Sherlekar et al. ............. 257/784
2014/0181774 A1* 6/2014 Hatamian et al. ............. 716/122

* cited by examiner

*Primary Examiner* — Mohammed Alam
(74) *Attorney, Agent, or Firm* — Ditthavong & Steiner, P.C.

(57) ABSTRACT

Methods for accommodating a non-integer multiple of the M2 pitch for the cell height of a semiconductor cell and the resulting devices are disclosed. Embodiments may include forming a cell within an integrated circuit (IC) with a height of a first integer and a remainder times a track pitch of a metal track layer, and forming power rails within the metal track layer at boundaries of the cell accommodating for the remainder.

17 Claims, 5 Drawing Sheets

FORMING MODIFIED CELL ARCHITECTURE FOR FINFET TECHNOLOGY AND RESULTING DEVICE

TECHNICAL FIELD

The present disclosure relates to cell sizing in semiconductors layouts. The present disclosure is particularly applicable to cell sizing compatible with fin field-effect transistor (FinFET) technology in semiconductor layouts for 20 nanometer (nm) technology nodes and beyond.

BACKGROUND

Standard cell height for semiconductor devices is conventionally an integer times the pitch of the second metal routing track (M2 pitch), such as an 8 track library or a 10 track library. Denser track libraries, such as the 8 track library, provide for better scaling but also impose significant design challenges, particularly on middle of line (MOL) constructs. Further, for FinFET semiconductor devices, the M2 pitch is usually different from the fin pitch so that a cell height that is a multiple of the M2 pitch results in a non-uniform fin grid.

A need therefore exists for a cell height that is a non-integer multiple of the M2 pitch, such as an 8.25 track, and the resulting device.

SUMMARY

An aspect of the present disclosure is a cell height this is a non-integer of the M2 pitch and an integer of the fin pitch.

Another aspect of the present disclosure is a device that includes a cell height this is a non-integer of the M2 pitch and an integer of the fin pitch.

Additional aspects and other features of the present disclosure will be set forth in the description which follows and in part will be apparent to those having ordinary skill in the art upon examination of the following or may be learned from the practice of the present disclosure. The advantages of the present disclosure may be realized and obtained as particularly pointed out in the appended claims.

According to the present disclosure, some technical effects may be achieved in part by a method including forming a cell within an integrated circuit (IC) with a height of a first integer and a remainder times a track pitch (e.g., M2 pitch) of a metal track layer, and forming power rails within the metal track layer at boundaries of the cell accommodating for the remainder.

An aspect of the present disclosure includes the track pitch being 64 nm, the first integer being eight and the remainder being a quarter. Another aspect includes defining the height of the cell also based on a second integer times a fin pitch. Yet another aspect includes the fin pitch being 48 nm and the second integer being 11. A further aspect includes the metal track layer being an M2 layer in the cell, and the power rails being above power rails of an M1 layer in the cell. Still another aspect includes forming the power rails of the M2 layer to a width of 48 nm. Another aspect includes forming a design macro (block) within the IC with tracks of the M2 layer misaligned with metal tracks of a global M2 layer outside of the design macro (block). An additional aspect includes forming upper metal layers consistent with the global metal tracks.

Another aspect of the present disclosure is a device including: a cell within an IC including: a metal track layer, the metal track layer including power rails at opposite boundaries of the cell, with a height of the cell being a first integer and a remainder times a track pitch of the metal track layer and a width of the power rails accommodating for the remainder.

An aspect includes the track pitch being 64 nm, the first integer being eight and the remainder being a quarter. Another aspect includes the cell further including: a fin layer having a fin pitch, wherein the height of the cell is a second integer times the fin pitch. Another aspect includes the fin pitch being 48 nm and the second integer being 11. Yet another aspect includes the metal track layer being an M2 layer in the cell, and the power rails being above power rails of an M1 layer in the cell. An additional aspect includes the power rails of the M2 layer having a width of 48 nm. Another aspect includes the IC further including: a global M2 layer including tracks, wherein tracks of the global M2 layer outside of a design macro (block) are misaligned with tracks of the M2 layer within the design macro (block). A further aspect includes the IC further including: one or more upper metal layers aligned with the global metal tracks.

Another aspect of the present disclosure includes a method including: forming a cell within an IC with a height of a first integer and a remainder times a track pitch of metal tracks of a metal track layer and a second integer times a fin pitch of a fin layer of the cell, and accommodating for the remainder by forming power rails of the metal track layer at boundaries of the cell. Another aspect includes the track pitch being 64 nm, the first integer being eight, the remainder being a quarter, and the second integer being eleven. A further aspect includes forming the power rails to a width of 48 nm. Another aspect includes forming a design macro (block) within the IC with tracks of the metal track layer mismatching metal tracks of a global metal layer outside of the design macro (block), and forming upper metal layers consistent with the global metal tracks.

Additional aspects and technical effects of the present disclosure will become readily apparent to those skilled in the art from the following detailed description wherein embodiments of the present disclosure are described simply by way of illustration of the best mode contemplated to carry out the present disclosure. As will be realized, the present disclosure is capable of other and different embodiments, and its several details are capable of modifications in various obvious respects, all without departing from the present disclosure. Accordingly, the drawings and description are to be regarded as illustrative in nature, and not as restrictive.

BRIEF DESCRIPTION OF THE DRAWINGS

The present disclosure is illustrated by way of example, and not by way of limitation, in the figures of the accompanying drawings and in which like reference numerals refer to similar elements and in which.

DETAILED DESCRIPTION

In the following description, for the purposes of explanation, numerous specific details are set forth in order to provide a thorough understanding of exemplary embodiments. It should be apparent, however, that exemplary embodiments may be practiced without these specific details or with an equivalent arrangement. In other instances, well-known structures and devices are shown in block diagram form in order to avoid unnecessarily obscuring exemplary embodiments. In addition, unless otherwise indicated, all numbers expressing quantities, ratios, and numerical properties of ingredients, reaction conditions, and so forth used in the specification and claims are to be understood as being modified in all instances by the term "about."

The present disclosure addresses and solves the current problem of MOL design challenges attendant upon dense (e.g., 8 track) semiconductor cell designs. In accordance with embodiments of the present disclosure, a non-integer (e.g., 8.25) multiple of the M2 pitch is used to define the cell height.

Methodology in accordance with an embodiment of the present disclosure includes forming a cell within an IC with a height of a first integer and a remainder times a pitch of a metal track layer. Next, power rails are formed within the metal track layer at boundaries of the cell accommodating for the remainder. By defining the cell height as the first integer and the remainder times the track pitch of the metal track layer, a dense cell can be created the does not suffer from typical design challenges of MOL constructs experienced by other dense cell designs (e.g., 8 times M2 track pitch), such as the cell allowing for a uniform fin gridding (e.g., fin pitch) for better fin process control.

Figure 1:
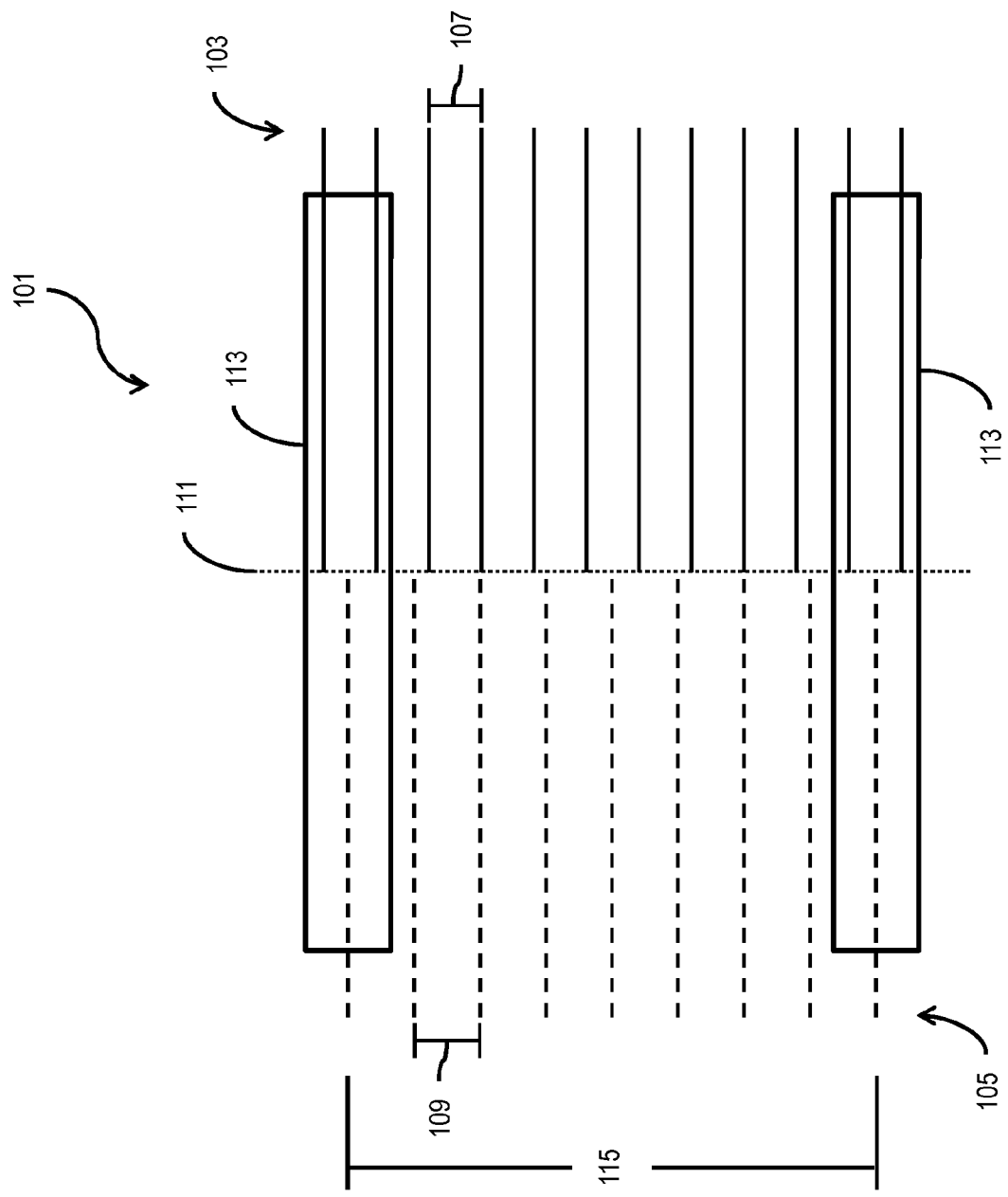
FIG. 1 schematically illustrates a semiconductor cell of a conventional cell height, in accordance with an exemplary embodiment.

FIG. 1 schematically illustrates a semiconductor cell 101 of a conventional cell height, such as 8 times the M2 pitch, in accordance with an exemplary embodiment. The cell 101 includes solid lines 103 indicating positions of fins within the cell 101, as well as dashed lines 105 indicating positions of metal tracks within a metal track layer (M2 layer). Thus, when forming fins for the cell 101, the fins are located along the solid lines 103, and when forming metal tracks for the M2 layer, the metal tracks are located along the dashed lines 105. The fins are formed with a fin pitch 107, and the metal tracks are formed with a M2 pitch 109. The fin pitch 107 may be 48 nm and the metal track pitch may be 64 nm. The solid lines 103 and the dashed lines 105 only to the dotted line 111, for illustrative convenience and to emphasize the difference in pitches. However, the resulting fins and metal tracks following the solid lines 103 and the dashed lines 105, respectively, extend across the entire cell 101.

At the top and bottom of the cell 101 are power rails 113. The power rails 113 may be part of a first metal track layer (e.g., M1 layer) that is between the fins and the M2 layer. The power rails define the cell height 115. Because the cell 101 is a conventional cell, the cell height 115 is a multiple of the M2 pitch 109, such as 8 times the M2 pitch 109 of 64 nm, which results in a cell height 115 of 512 nm.

Because the cell height 115 is a multiple of the M2 pitch 109, which is different than the fin pitch 107, the cell 101 has non-uniform fin gridding, which results in poor fin control. The smaller cell height 115 of 512 nm also results in MOL design difficulty.

Figure 2:
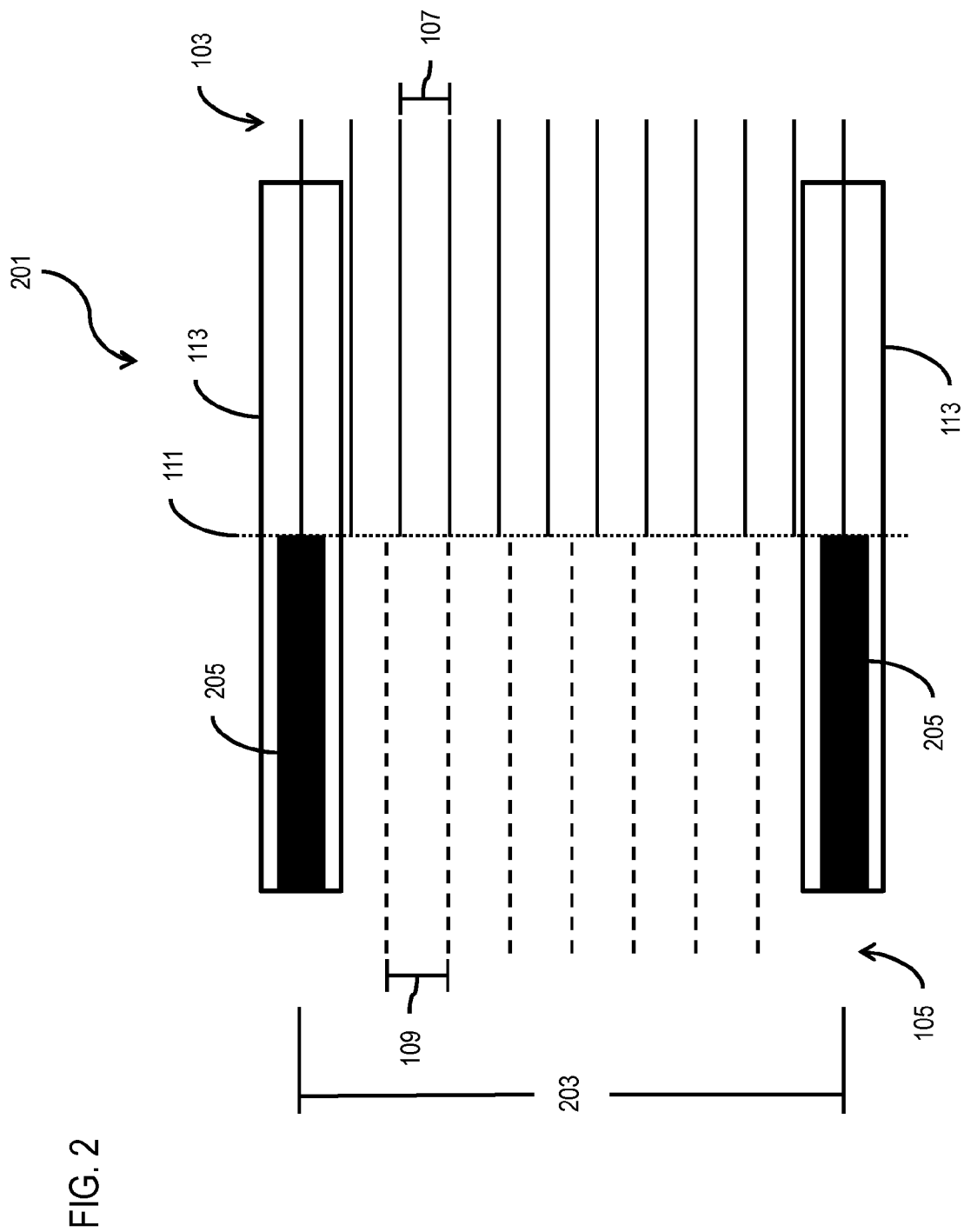
FIG. 2 schematically illustrates a semiconductor cell of a modified cell height, in accordance with an exemplary embodiment.

Accordingly, FIG. 2 schematically illustrates a semiconductor cell 201 of a modified cell height 203, in accordance with an exemplary embodiment. The modified cell height 203 is determined based on Equation 1:

$$H = \left\{ \text{Integer}\left(8 \times \frac{P1}{P2}\right) \times 1 \right\} \times P2 \qquad (1)$$

where H is the cell height 203, P1 is the M2 pitch 109, and P2 is the fin pitch 107. Accordingly, for the M2 pitch 109 of 64 nm and the fin pitch 107 of 48 nm provided above, the resulting cell height is 528 nm. Accordingly, the modified cell height 203 is an integer and a remainder times the M2 pitch or, based on the above-discussed dimensions, 8.25 from dividing the cell height 115 of 528 nm by the M2 pitch 109 of 64 nm.

To accommodate for the additional cell height, such as 16 nm based on the above-discussed dimensions, the modified cell 201 also includes M2 power rails 205. As illustrated, the M2 power rails 205 are placed above the M1 power rails 113. Further, the width W of the M2 power rails 205 is defined by Equation 2:

$$W = H - \left[\left(\text{Integer}\left(\frac{H}{P1}\right)\right) \times P1\right] + W1 \qquad (2)$$

where H is the cell height, P1 is the M2 pitch and W1 is the default M2 width (e.g., the minimum M2 width). The width W can also be thought of as the default M2 width plus the addition of the cell height, which in the case of a M2 width of 32 nm plus the difference between the modified cell height 528 nm and the standard cell height 512 nm, the width and the pitch of the M2 power rails 205 are 48 nm and 72 nm, respectively. Although the above discussion is based on an M2 pitch of 64 nm and a fin pitch of 48 nm, the discussion is also applicable to other M2 pitches and other fin pitches.

Figure 3A:
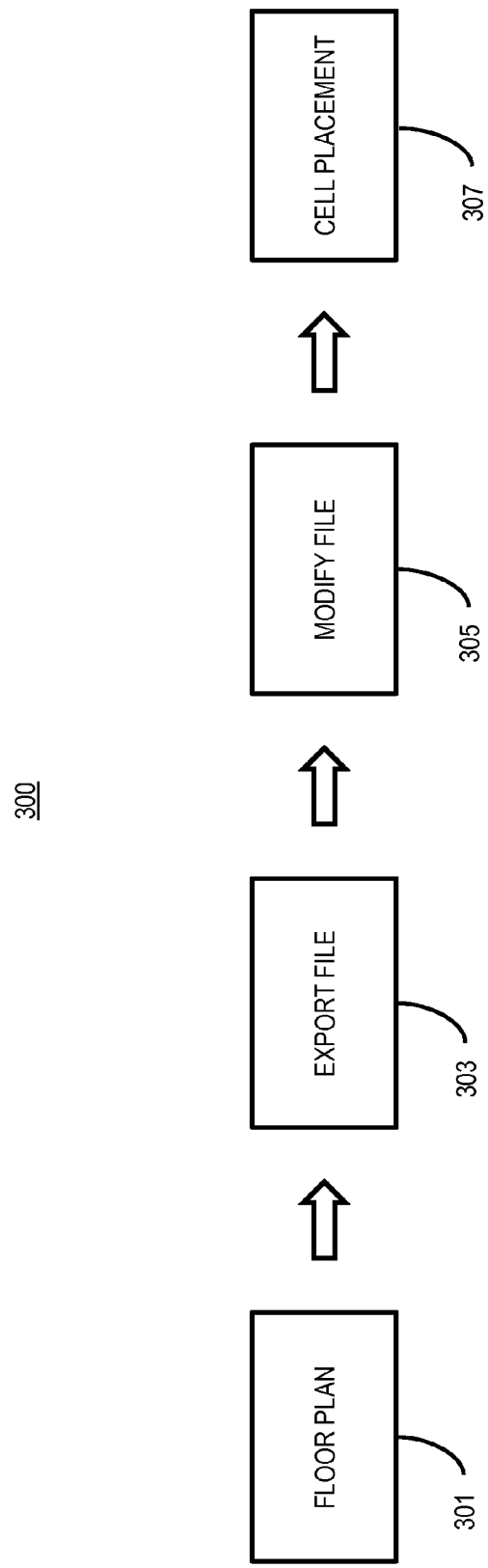
FIG. 3A illustrates a method for modifying a cell floor plan, in accordance with an exemplary embodiment.
Figure 3B:
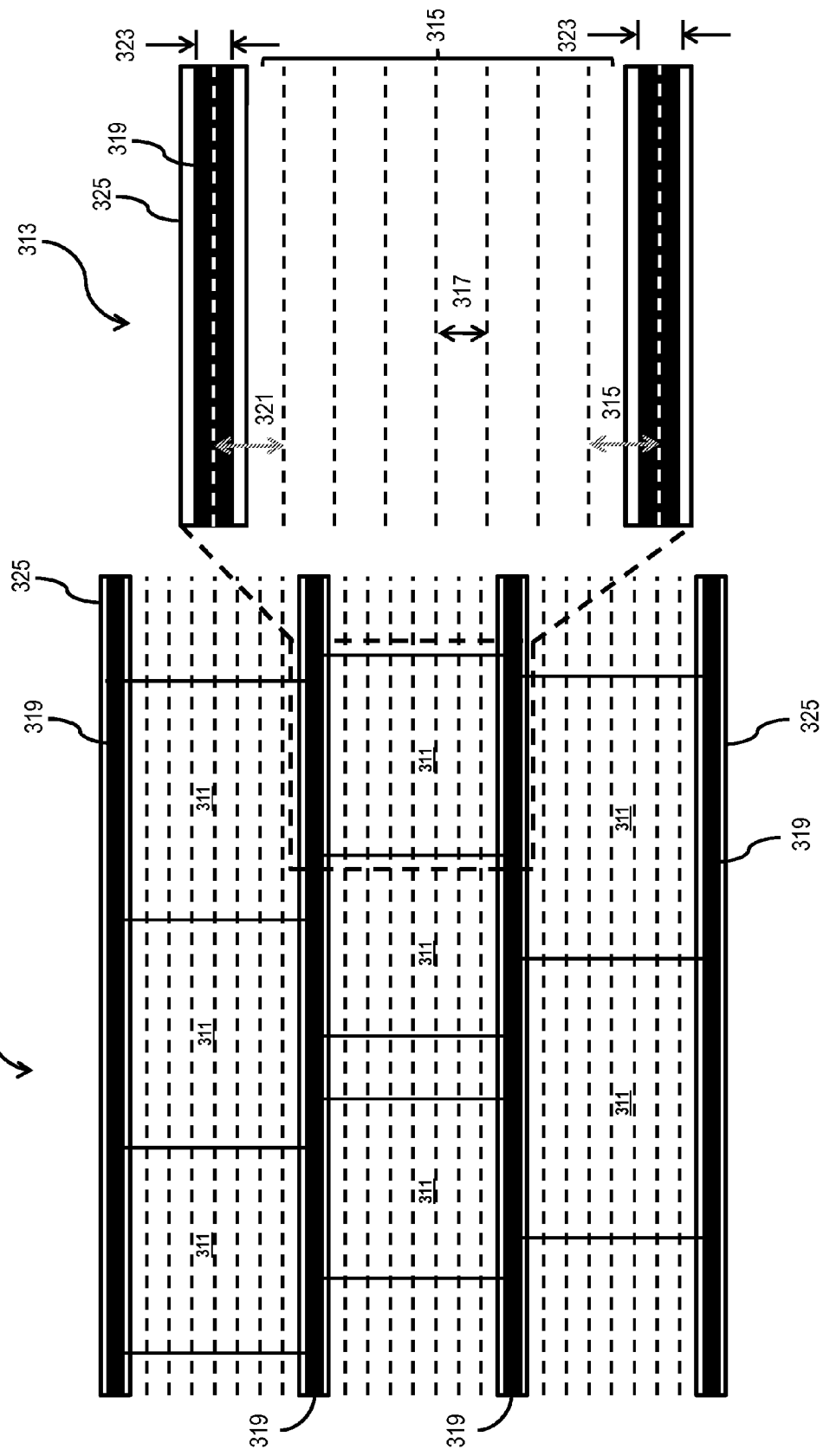
FIG. 3B illustrates a design macro (block) within an IC, in accordance with an exemplary embodiment.
Figure 4:
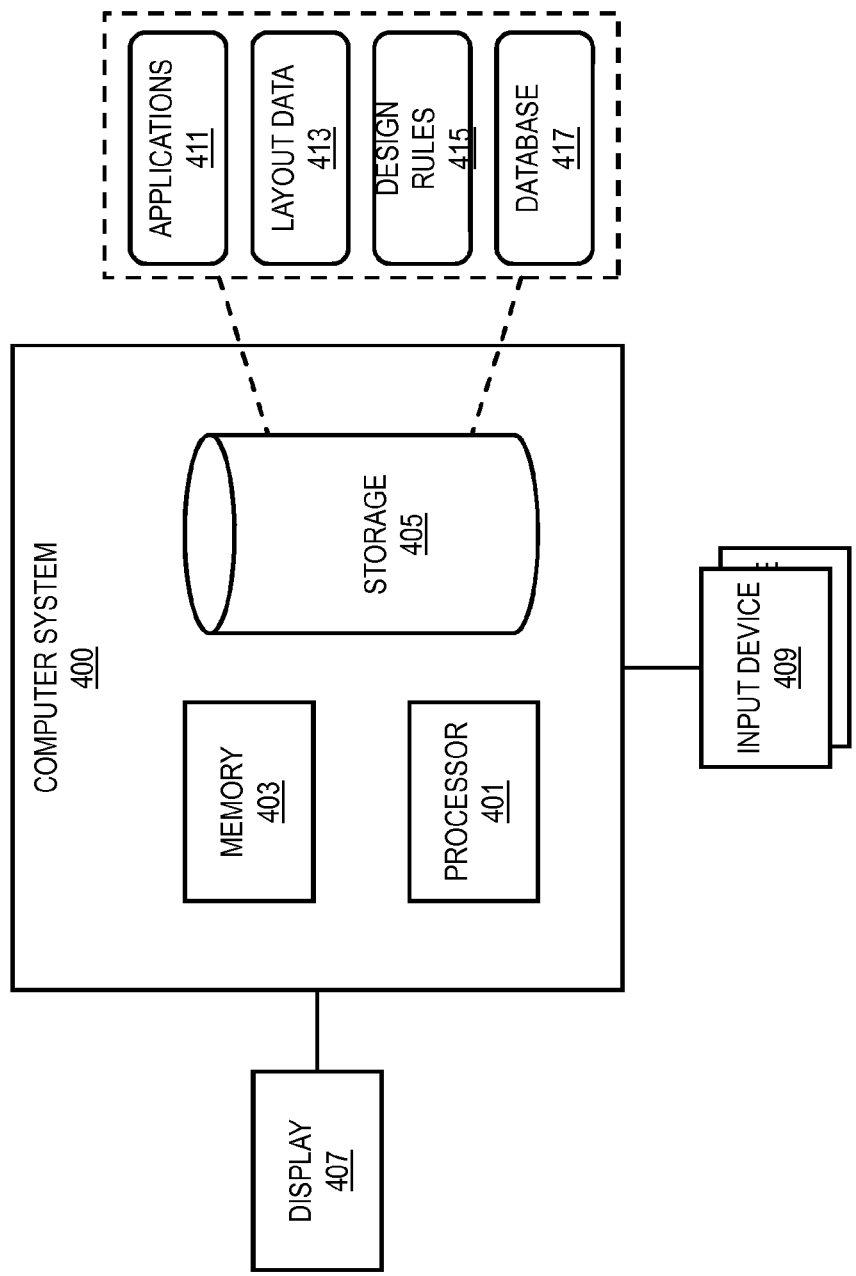
FIG. 4 schematically illustrates a computer system for implementing the process of FIG. 3, according to an exemplary embodiment.

Further, traditional floor planning assumes a uniform global M2 layer gridding based on a single M2 pitch, such as 64 nm. Thus, a traditional floor planning system cannot handle the above-discussed design that includes two different pitches of the M2 pitch and the M2 power rails. Accordingly, FIG. 3A illustrates a process 300 flow for modifying a traditional floor plan that accepts only a uniform M2 gridding for the above-discussed design. The process 300 is implemented in, for instance, a chip set including a processor and a memory as shown in FIG. 4. In step 301, a traditional floor plan is created for cell placement that includes the uniform, traditional gridding of the M2 global layer, such as gridding based on the uniform pitch of 64 nm. Then, at step 303, the floor plan is exported. The floor plan can be exported as any type of file, such as a Design Exchange Format. The exported floor plan includes the uniformly gridded global M2 layer. At step 305, the floor plan is modified to accept the new M2 layer specifications of the local M2 pitch of 64 nm with 72 nm pitch M2 power rails. The floor plan is modified such that, for the above-discussed dimensions, every eighth M2 track is enlarged from a 64 nm pitch to a 72 nm pitch for forming the M2 power rails. After modifying the floor plan, at step 307 the semiconductor cells with the modified cell height can then be placed based on the enlarged cell height and between the M2 power rails. Further, upper metal tracks may remain consistent with the global metal gridding so that there are no concerns on a macro level with input/output connections. FIG. 3B illustrates a design block (macro) 310 with multiple cells 311 within an IC modified to allow an 8.25 track M2 layer, in accordance with an exemplary embodiment. As illustrated in the blow-up portion 313 representing a cell 311 within the design block, the design block includes an M2 track 315 at a specified pitch 317, such as 64 nm. The design block also includes M2 power rails 319 with a modified pitch 321 as compared to the specified pitch 317, such as 72 nm, and a width 323, such as 48 nm, above M1 power rails 325. The IC can include other design blocks at different M2 track pitches, such as an 8 and/or 10 track library, while including the local 8.25 track macro. Further, upper metal tracks can be consistent with the global track.

The processes described herein may be implemented via software, hardware, firmware, or a combination thereof. Exemplary hardware (e.g., computing hardware) is schematically illustrated in FIG. 4. As shown, computer system 400 includes at least one processor 401, at least one memory 403, and at least one storage 405. Computer system 400 may be coupled to display 407 and one or more input devices 409, such as a keyboard and a pointing device. Display 407 may be utilized to provide one or more GUI interfaces. Input devices 409 may be utilized by users of computer system 400 to interact with, for instance, the GUI interfaces. Storage 405 may store applications 411, layout data (or information) 413, design rules 415, and at least one shape and/or cell database (or repository) 417. Applications 411 may include instructions (or computer program code) that when executed by processor 401 cause computer system 400 to perform one or more processes, such as one or more of the processes described herein. In exemplary embodiments, applications 411 may include one or more manufacturability analysis and/or yield enhancement tools.

The embodiments of the present disclosure achieve several technical effects, including uniform fin gridding and better fin process control, ease of MOL design because of taller cell height, and better electrical performance because of the additional 48 nm M2 power rails. The present disclosure enjoys industrial applicability associated with the designing and manufacturing of any of various types of highly integrated semiconductor devices used in microprocessors, smart phones, mobile phones, cellular handsets, set-top boxes, DVD recorders and players, automotive navigation, printers and peripherals, networking and telecom equipment, gaming systems, and digital cameras.

In the preceding description, the present disclosure is described with reference to specifically exemplary embodiments thereof. It will, however, be evident that various modifications and changes may be made thereto without departing from the broader spirit and scope of the present disclosure, as set forth in the claims. The specification and drawings are, accordingly, to be regarded as illustrative and not as restrictive. It is understood that the present disclosure is capable of using various other combinations and embodiments and is capable of any changes or modifications within the scope of the inventive concept as expressed herein.

What is claimed is:

1. A method comprising:
forming a cell within an integrated circuit (IC), the cell having a height of a first integer and a remainder times a track pitch of a metal track layer; and
forming power rails within the metal track layer at boundaries of the cell accommodating for the remainder, wherein:
the track pitch is 64 nanometers (nm),
the first integer is eight, and
the remainder is a quarter.

2. The method according to claim 1, further comprising:
defining the height of the cell also based on a second integer times a fin pitch.

3. The method according to claim 2, wherein the fin pitch is 48 nm and the second integer is 11.

4. The method according to claim 1, wherein the metal track layer is an M2 layer (M2) in the cell, and the power rails are above power rails of an M1 layer in the cell.

5. The method according to claim 4, comprising:
forming the power rails of the M2 layer to a width of 48 nm.

6. The method according to claim 1, further comprising:
forming the cell within the IC with tracks of the M2 layer misaligned with metal tracks of a global M2 layer outside of the cell.

7. The method according to claim 6, further comprising:
forming upper metal layers consistent with the global metal tracks.

8. An apparatus comprising:
a cell within an integrated circuit (IC) comprising:
a metal track layer, the metal track layer including power rails at opposite boundaries of the cell, wherein:
a height of the cell is a first integer and a remainder times a track pitch of the metal track layer and a width of the power rails accommodates for the remainder,
the track pitch is 64 nanometers (nm),
the first integer is eight, and
the remainder is a quarter.

9. The apparatus according to claim 8, the cell further comprising:
a fin layer having a fin pitch,
wherein the height of the cell is a second integer times the fin pitch.

10. The apparatus according to claim 9, wherein the fin pitch is 48 nm and the second integer is 11.

11. The apparatus according to claim 8, wherein the metal track layer is an M2 layer in the cell, and the power rails are above power rails of an M1 layer in the cell.

12. The apparatus according to claim 11, comprising:
the power rails of the M2 layer having a width of 48 nm.

13. The apparatus according to claim 8, the IC further comprising:
a global M2 layer including tracks,
wherein tracks of the global M2 layer outside of the cell are misaligned with tracks of the M2 layer within the cell.

14. The apparatus according to claim 13, the IC further comprising:
one or more upper metal layers aligned with the tracks of the global M2 layer.

15. A method comprising:
forming a cell within an integrated circuit (IC), the cell having a height of a first integer and a remainder times a track pitch of metal tracks of a metal track layer and a second integer times a fin pitch of a fin layer of the cell; and
accommodating for the remainder by forming power rails of the metal track layer at boundaries of the cell, wherein:
the track pitch is 64 nanometers (nm),
the first integer is eight,
the remainder is a quarter, and
the second integer is eleven.

16. The method according to claim 15, comprising:
forming the power rails to a width of 48 nm.

17. The method according to claim 15, further comprising:
forming the cell within the IC with tracks of the metal track layer mismatching metal tracks of a global metal layer outside of the cell; and
forming upper metal layers consistent with the metal tracks of the global metal layer.

* * * * *